(12) United States Patent
Wang et al.

(10) Patent No.: US 8,779,475 B2
(45) Date of Patent: Jul. 15, 2014

(54) SEMICONDUCTOR DEVICE AND METHOD OF MANUFACTURING THE SAME

(76) Inventors: Guilei Wang, Beijing (CN); Chunlong Li, Beijing (CN); Chao Zhao, Kessel-lo (BE)

( * ) Notice: Subject to any disclaimer, the term of this patent is extended or adjusted under 35 U.S.C. 154(b) by 0 days.

(21) Appl. No.: 13/582,432

(22) PCT Filed: Nov. 28, 2011

(86) PCT No.: PCT/CN2011/001978
§ 371 (c)(1),
(2), (4) Date: Sep. 3, 2012

(87) PCT Pub. No.: WO2012/174694
PCT Pub. Date: Dec. 27, 2012

(65) Prior Publication Data
US 2013/0105859 A1    May 2, 2013

(51) Int. Cl.
| | |
|---|---|
| *H01L 27/085* | (2006.01) |
| *H01L 29/16* | (2006.01) |
| *H01L 29/78* | (2006.01) |
| *H01L 21/02* | (2006.01) |
| *H01L 29/51* | (2006.01) |
| *H01L 21/8258* | (2006.01) |
| *H01L 29/20* | (2006.01) |
| *H01L 21/8238* | (2006.01) |
| *H01L 21/28* | (2006.01) |

(52) U.S. Cl.
CPC .............. *H01L 29/78* (2013.01); *H01L 29/16* (2013.01); *H01L 29/7833* (2013.01); *H01L 21/02532* (2013.01); *H01L 29/51* (2013.01); *H01L 21/8258* (2013.01); *H01L 29/2003* (2013.01); *H01L 21/823807* (2013.01); *H01L 21/28264* (2013.01)

USPC .......................................... 257/255; 257/190

(58) Field of Classification Search
USPC .................... 257/190, 618, 738, 777
See application file for complete search history.

(56) References Cited

U.S. PATENT DOCUMENTS

| | | | | |
|---|---|---|---|---|
| 5,477,169 A | * | 12/1995 | Shen et al. ...................... | 326/55 |
| 6,150,690 A | * | 11/2000 | Ishibashi et al. .............. | 257/306 |
| 7,842,982 B2 | | 11/2010 | Moriyama et al. | |
| 8,003,467 B2 | | 8/2011 | Ng et al. | |

(Continued)

FOREIGN PATENT DOCUMENTS

| | | |
|---|---|---|
| CN | 101515568 A | 8/2009 |
| CN | 101517717 A | 8/2009 |
| CN | 101728328 A | 6/2010 |

*Primary Examiner* — Yu-Hsi D Sun
*Assistant Examiner* — Christina Sylvia
(74) *Attorney, Agent, or Firm* — Treasure IP Group

(57) ABSTRACT

The present invention discloses a semiconductor device, comprising: a substrate, an insulating isolation layer formed on the substrate, a first active region layer and a second active region layer formed in the insulating isolation layer, characterized in that the carrier mobility of the first active region layer and/or second active region layer is higher than that of the substrate. In accordance with the semiconductor device and the manufacturing method thereof in the present invention, an active region formed of a material different from that of the substrate is used, the carrier mobility in the channel region is enhanced, thereby the device response speed is substantially improved and the device performance is enhanced greatly. Furthermore, unlike the existing STI manufacturing process, for the present invention, an STI is formed first, and then filling is performed to form an active region, thus avoiding the problem of generation of holes in STI, and improving the device reliability.

8 Claims, 5 Drawing Sheets

(56) References Cited

U.S. PATENT DOCUMENTS

2005/0285161 A1* 12/2005 Kang et al. .................. 257/288
2006/0183296 A1* 8/2006 Yoo et al. .................... 438/424
2007/0155142 A1* 7/2007 Jin et al. ...................... 438/514
2009/0189199 A1* 7/2009 Moriyama et al. ........... 257/255

* cited by examiner

SEMICONDUCTOR DEVICE AND METHOD OF MANUFACTURING THE SAME

CROSS REFERENCE

This application is a National Phase application of, and claims priority to, PCT Application No. PCT/CN2011/001978, filed on Nov. 28, 2011, entitled 'SEMICONDUCTOR DEVICE AND METHOD OF MANUFACTURING THE SAME', which claimed priority to Chinese Application No. CN 201110165239.0, filed on Jun. 20, 2011. Both the PCT Application and Chinese Application are incorporated herein by reference in their entireties.

FIELD OF THE INVENTION

The present invention relates to a semiconductor device and method of manufacturing the same, particularly to a semiconductor device, which takes high mobility materials surrounded by STI as the channel and a method of manufacturing the same.

BACKGROUND OF THE INVENTION

With the continuous reduction in size of a semiconductor device, enhancing the carrier mobility of channel becomes a very important technique. In the design of a stress layer of a substrate, different materials have different characteristics such as lattice constant, dielectric constant, forbidden gap, particularly carrier mobility, etc., as shown in Table 1 below.

TABLE 1

| Material | Lattice constant (nm) | Dielectric constant | Forbidden gap(eV) | Mobility ($cm^2$/V-s) electron | Mobility ($cm^2$/V-s) hole |
|---|---|---|---|---|---|
| Si | 0.5431 | 11.8 | 1.12 | 1600 | 430 |
| Ge | 0.5675 | 16 | 0.66 | 3900 | 1900 |
| GaAs | 0.5653 | 12.4 | 1.42 | 9200 | 400 |
| InAs | 0.6058 | 14.8 | 0.36 | 40000 | 500 |
| InSb | 0.648 | 17.7 | 0.17 | 77000 | 850 |

It can be seen from Table 1 that among the above possible materials for substrate, Ge has the highest hole mobility and a relatively higher electron mobility, thus can make the performance of the PMOS taking it as the channel region best and the performance of the NMOS good. Using Ge as the substrate of a semiconductor device will greatly enhance the carrier mobility, thus enabling manufacture of a higher-speed large scale integrated circuit (LSIC). Similarly, using InSb as the channel of NMOS can maximum the performance of the NMOS, meanwhile the performance of PMOS of InSb is also good.

Further, it can also be seen from Table 1 that materials Ge and GaAs have a similar lattice constant as that of the material Si, thus they can be easily integrated on a Si substrate commonly used in the semiconductor technology, such that a semiconductor device with better performance can be manufactured by the technology without making great improvements thereto, thereby improving the performance while reducing the cost at the same time. However, certain disparity exists between the lattice constant of InAs and InSb and that of the material Si, a transition layer or a buffer layer which may be made of GaAs and GaN etc. with a lattice constant similar to that of Si shall be added when materials of InAs and InSb are used.

In the design of a semiconductor device and an integrated circuit thereof, generally a shallow trench isolation (STI) is used to manufacture the insulating isolation among a plurality of devices in the substrate. The known method for manufacturing a STI comprises first etching a trench in the substrate, then depositing an insulating film made of e.g., an oxide in the formed trench by a process such as chemical vapor deposition (CVD). With reduction in the device size, the aspect ratio of corresponding STI becomes larger continuously and the step coverage of the oxide insulating film becomes poorer, that is, the oxide insulating film on top of the narrower trench may join earlier while the trench below is not completely filled, thus holes or gaps may exist in the STI, resulting in that the insulating property of the device deteriorates and reliability thereof becomes worse.

Overall, the existing semiconductor device with Si channel surrounded by STI has poor performance and reliability, the carrier mobility in the channel region shall be further improved and holes in STI shall be removed to improve the electrical performance and reliability of the semiconductor device.

SUMMARY OF THE INVENTION

Therefore, an object of the present invention is to further improve the carrier mobility in a channel region and to remove holes in STI, thereby improving the electrical performance and reliability of the semiconductor device.

The present invention provides a semiconductor device, comprising: a substrate, an insulating isolation layer formed on the substrate, a first active region layer and a second active region layer formed in the insulating isolation layer, characterized in that the carrier mobility of the first active region layer and/or second active region layer is higher than that of the substrate.

Wherein the hole mobility of the first active region layer is higher than that of the substrate, and the electron mobility of the second active region layer is higher than that of the substrate. Wherein the substrate is formed of silicon, the first active region layer is formed of Ge, and the second active region layer is formed of InSb. Wherein a buffer layer formed of GaAs or GaN exists between the second active region layer and the substrate.

Wherein a gate stack constituted by a gate insulating layer and a gate material layer is formed on the first and second active region layers, respectively, source/drain regions are formed in the active region layers on both sides of the gate stack, and source/drain contacts are formed on the source/drain regions. Wherein the gate material layer is formed of one of polysilicon, metal, metal nitride or the combinations thereof. Wherein the gate insulating layer is formed of high K material, and the gate insulating layer comprises no oxide of the substrate and/or the active region layer.

Wherein a liner layer is comprised between the substrate and the insulating isolation layer. Wherein the liner layer is formed of silicon nitride or silicon oxide.

The present invention also provides a method for manufacturing a semiconductor device, comprising: forming an insulating isolation layer on a substrate; forming a first insulating isolation layer trench in the insulating isolation layer; forming a first active region layer in the first insulating isolation layer trench; forming a second insulating isolation layer trench in the insulating isolation layer; forming a second active region layer in the second insulating isolation layer trench; forming a semiconductor device structure in and above the first and second active region layers; characterized in that the carrier mobility of the first and/or second active region layer is higher than that of the substrate.

Wherein the hole mobility of the first active region layer is higher than that of the substrate, and the electron mobility of the second active region layer is higher than that of the substrate. Wherein the substrate is formed of silicon, the first active region layer is formed of Ge, and the second active region layer is formed of InSb. Wherein a buffer layer formed of GaAs or GaN is formed in the second insulating isolation layer trench after it is formed.

Wherein a liner layer is further formed on the substrate after the insulating isolation layer is formed, and the linear layer is formed of silicon nitride or silicon oxide.

Wherein the insulating isolation layer is formed by depositing silicon oxide on the substrate by HDP, LPCVD, or SACVD.

Wherein a mask pattern is formed on the insulating isolation layer, then the insulating isolation layer is etched by taking the mask pattern as a mask to form the first and/or second insulating isolation layer trench to expose the substrate. Wherein the insulating isolation layer is over-etched down to the upper surface of the substrate.

Wherein the first active region layer and the second active region layer are epitaxially deposited in the insulating isolation layer trench by ALD, RPCVD, UHVCVD or MBE.

In accordance with the semiconductor device and the manufacturing method thereof in the present invention, an active region formed of a material different from that of the substrate is used, the carrier mobility in the channel region is enhanced, thereby the device response speed is substantially improved and the device performance is enhanced greatly. Furthermore, unlike the existing STI manufacturing process, for the present invention, an STI is formed first, and then filling is performed to form an active region, thus avoiding the problem of generation of holes in STI, and improving the device reliability.

The objects of the present invention and other objects not listed herein are satisfied in the independent claims of the present application. The embodiments of the present invention are defined in the independent claims, and the specific features are defined in the dependent claims.

BRIEF DESCRIPTION OF THE DRAWINGS

The technical solutions of the present invention are described in detail with reference to the drawings below, wherein.

DETAILED DESCRIPTION OF THE EMBODIMENTS

The features of the technical solutions of the present invention and the technical effects thereof are illustrated in detail in combination with the schematic embodiments with reference to the drawings, disclosed herein a semiconductor device which takes high mobility thin film materials surrounded by STI as the channel and a method of manufacturing the same. It should be pointed out that like reference signs indicate like structures, the terms such as "first", "second", "above", "below" used in the present invention may be used to modify various device structures or process steps. Except for specific explanations, these modifications do not imply the spatial, sequential or hierarchical relationships of the structures of the modified device or the process steps.

Figure 1A:
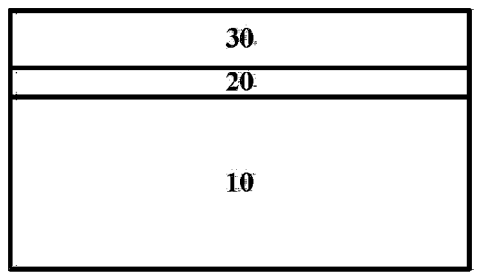
FIGS. 1A, 2A, 3A, 4A, 5A, 6A, 7A and 8A are diagrammatic is cross-sections respectively illustrate the steps of the method for manufacturing the semiconductor device in accordance with the present invention.
Figure 1B:
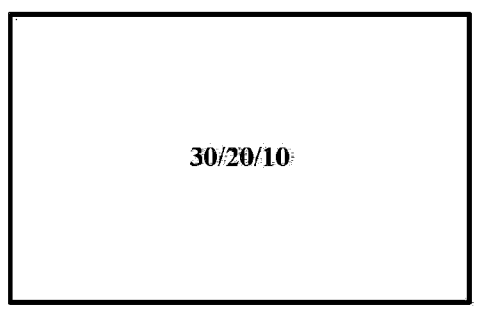
FIGS. 1B, 2B, 3B, 4B, 5B, 6B, 7B and 8B are top schematic diagrams respectively illustrate the steps of the method for manufacturing the semiconductor device in accordance with the present invention.

First, referring to FIGS. 1A and 1B, a liner layer and an insulating isolation layer are formed on the substrate. The substrate 10 may be common semiconductor silicon based substrates such as bulk Si and Si on insulator (SOI), bulk Ge and Ge on insulator (GeOI), compound semiconductor substrates such as SiGe, GaAs, and GaN, or insulating substrates such as sapphire, SiC, and MN. The substrate is selected to depending on the requirement of the electrical performance of the specific semiconductor device to be manufactured thereon. In the present invention, the semiconductor device as illustrated in the embodiment may be, for example, a field effect transistor (MOSFET), so in terms of compatibility with other processes and cost control, bulk silicon or SOI is preferably selected as the material for the substrate 10. A liner layer 20 is deposited on the substrate 10 by a conventional process such as CVD, and the material of the layer may be oxide, nitride, or oxynitride, specifically, such as silicon nitride ($Si_3N_4$ or SiNx, where x is 1~2) or silicon oxide (SiO or $SiO_2$). The liner layer 20 is used as a stop layer for the later etch to protect the substrate 10, and the thickness thereof is set depending on the requirement of the etching process. Then, an insulating isolation layer 30, formed of a material such as silicon oxide, particularly silicon dioxide, may be deposited on the liner layer 20 by a process such as low pressure chemical vapor deposition (LPCVD), sub-atmospheric chemical vapor deposition (SACVD), high density plasma chemical vapor deposition (HDPCVD), and an appropriate pressure and temperature shall be selected to control the uniformity, step coverage and deposition speed. The insulating isolation layer 30 is used as the insulating isolation among a plurality of semiconductor devices on the substrate 10, that is, the traditional STI filler, and the thickness thereof is set depending on the requirement of insulating isolation. It should be noted that in the cross-section of FIG. 1A and the top view of FIG. 1B, the substrate 10, the liner layer 20 and the insulating isolation layer 30 have substantially the same areas, in practical manufacture, the above basic structure can be formed only around the center of the active region or wafer in accordance with the layout, the following steps are similar, and no more unnecessary details will be provided.

Figure 2A:
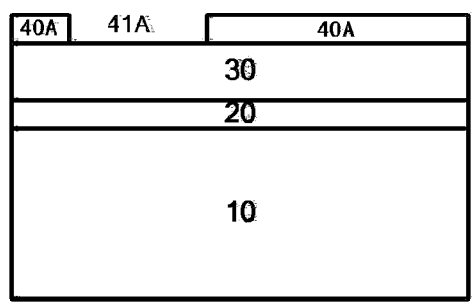
Figure 2B:
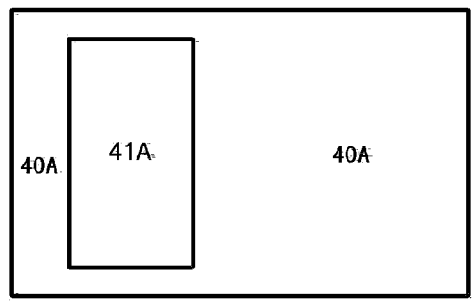

Second, referring to FIGS. 2A and 2B, a first mask pattern is formed on the insulating isolation layer. A mask layer is formed on the insulating isolation layer 30 and is patterned to form a first mask pattern 40A. The mask layer may be photoresist coated on the insulating isolation layer 30 by a process such as spin coating, then a first mask pattern 40A of the photoresist is formed by the photolithographic steps including exposing and developing etc. The mask layer may also be a hard mask layer such as silicon nitride, in such case, a first hard mask pattern 40A is formed by etching after a soft mask formed of photoresist is formed thereon. As shown in FIG. 2B, the first mask pattern 40A is complementary to the first active region (which is indicated as 50A in the following) to be formed, that is, the active region is surrounded by the mask pattern while a plurality of mask pattern openings 41A exposing the insulating isolation layer 30 are left, the part of the insulating isolation layer 30 below the mask pattern 40A is used to form an STI later, thus the width of the mask pattern 40A is set depending on the requirement of the width of STI.

Figure 3A:
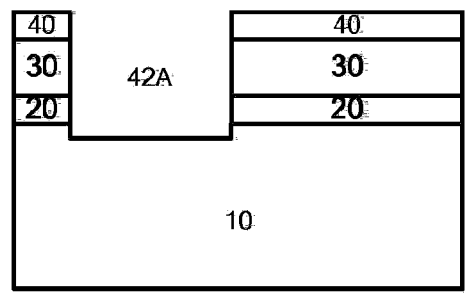
Figure 3B:
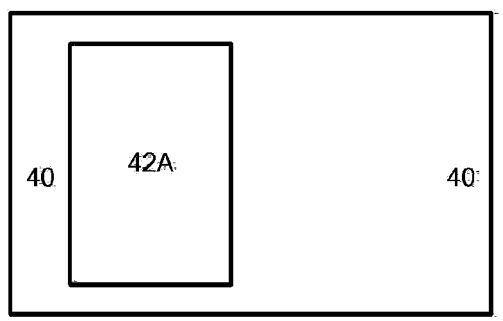

Then, referring to FIGS. 3A and 3B, a first insulating isolation layer trench is formed by etching with the mask pattern as a mask. After the mask pattern 40 and the mask pattern openings 41 are formed, a part of insulating isolation layer 30 and the liner layer 20 exposed in the first mask pattern opening 41A are etched to form a first insulating isolation layer trench 42A. Wherein the insulating isolation layer trench 42A may correspondingly become the first insulating isolation layer trench 42A for PMOS depending on different mask patterns thereon. The remained part left in the insulating isolation layer is used as the insulating isolation structure of the device, that is, equivalent to the STI in the prior art. When the insulating isolation layer 30 is formed of silicon oxide, wet etching by using dilute hydrofluoric acid, or dry etching by using fluorocarbon-based, $SF_6$-based or $NF_3$-based plasma (which may also be doped with $O_2$, HBr, $CL_2$ etc.) may be performed to expose the substrate 10. Slight over-etching may also be performed, for example, over-etching to a depth of about 1~10 nm into the substrate 10 to rough the upper surface thereof, which is helpful for forming the Ge film later.

Figure 4A:
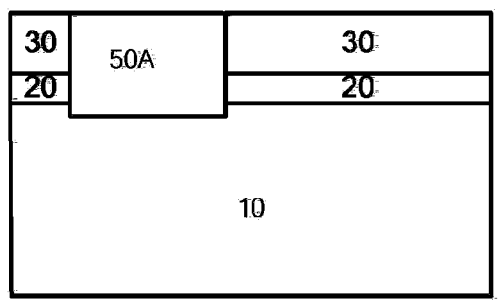
Figure 4B:
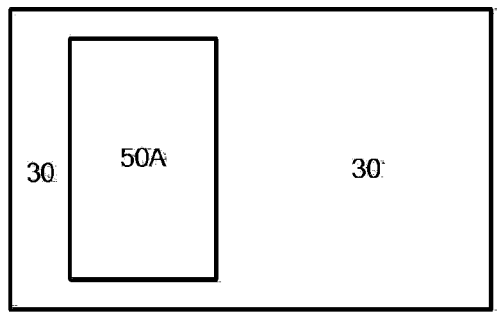

Next, referring to FIGS. 4A and 4B, a first active region layer is formed in the first insulating isolation layer trench. After the first insulating isolation layer trench 42A is formed, the mask pattern 40 is removed, and the surface of the exposed substrate 10 is wet cleaned such that the later epitaxial growth will not be affected by impurities. When the mask pattern 40 is formed of photoresist, the mask pattern 40 formed of photoresist may either be removed by organic solvent such as aceton and aromatic series or inorganic solvent consisting of sulfuric acid and hydrogen peroxide, or be removed by dry etching using oxygen plasma. When the mask pattern 40 is formed of silicon nitride, the mask pattern 40 may be removed by using hot phosphoric acid. As for the substrate 10, it may be wet cleaned, and the cleaning agent may include ammonia water, hydrogen peroxide, deionized water, dilute hydrochloric acid, dilute sulphuric acid, dilute hydrofluoric acid, dilute hydrogen nitrate, choline, Carol acid, and ozonated water etc. as well as the combinations thereof. Next, after the surface aqueous vapor and the impurity of C are removed by high temperature baking, a first active region layer 50A is epitaxially deposited in the first insulating isolation layer trench 42A, and the layer is made of a material different from that of the substrate 10 and has a carrier mobility (particularly the hole carrier mobility) higher than that of the substrate 10, for manufacturing the PMOS. In the embodiment of the present invention, the first active region layer 50A is formed of a material of Ge, preferably pure Ge film, besides the material may also be selected from GaAs, InAs, InSb and SiGe etc. in accordance with table 1. The epitaxial deposition may be performed by a process such as reduced pressure chemical vapor deposition (RPCVD), ultra-high vacuum chemical vapor deposition (UHVCVD) or molecular beam epitaxy (MBE), etc. Preferably, the deposition is a low temperature deposition, with a temperature ranges from about 250° C. to 600° C. Gases such as HCl may be mixed in the feed gas to improve the selectivity of the epitaxy, that is, enabling the active region layer to be deposited within the first insulating isolation trench 42A, instead of being deposited on the insulating isolation layer 30. When the first active region layer 50A is formed by epitaxial deposition, redundant material for the active region layer is removed by chemical mechanical polishing (CMP) and/or wet cleaning to control the morphology of the first active region layer 50A, that is, removing the part that is higher than the insulating isolation layer 30.

Figure 5A:
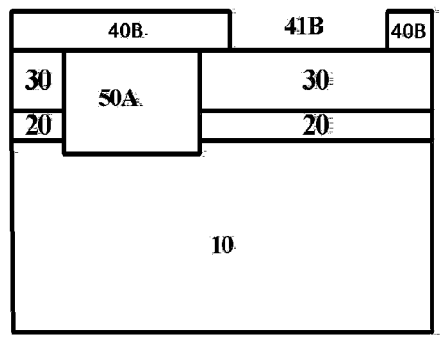
Figure 5B:
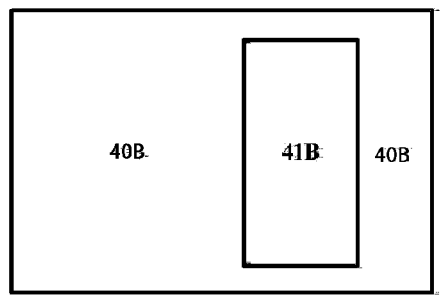

Thereafter, referring to FIGS. 5A and 5B, a second mask pattern is formed on the insulating isolation layer. A mask layer is formed on the insulating isolation layer 30 and is patterned to form a second mask pattern 40B. The mask layer may be photoresist coated on the insulating isolation layer 30 by a process such as spin coating, then a second mask pattern 40B of the photoresist is formed by the photolithographic steps including exposing and developing etc. The mask layer may also be a hard mask layer such as silicon nitride, in such case, a first hard mask pattern 40A is formed by etching after a soft mask formed of photoresist is formed thereon. As shown in FIG. 5B, the second mask pattern 40B is complementary to the second active region (which is indicated as 50B in the following) to be formed, that is, the active region is surrounded by the mask pattern while a plurality of mask pattern openings 41B exposing the insulating isolation layer 30 are left, the part of the insulating isolation layer 30 below the mask pattern 40B is used to form an STI later, thus the width of the mask pattern 40B is set depending on the requirement of the width of STI.

Figure 6A:
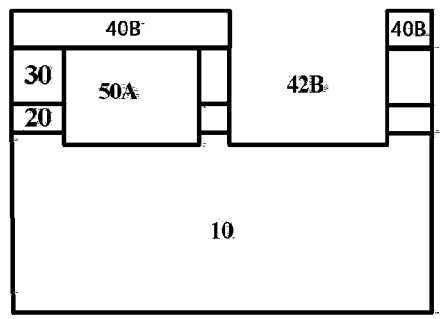
Figure 6B:
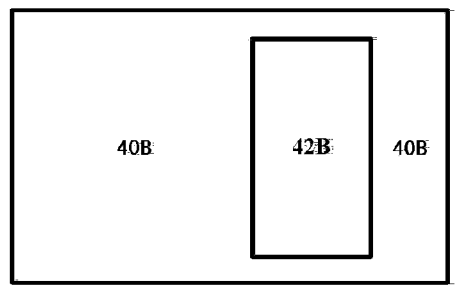

Then, referring to FIGS. 6A and 6B, a second insulating isolation layer trench is formed by etching with the second mask pattern as a mask. After the mask pattern 40B and the mask pattern openings 41B are formed, a part of insulating isolation layer 30 and the liner layer 20 exposed in the second mask pattern opening 41B are etched to form a second insulating isolation layer trench 42B. Wherein the insulating isolation layer trench 42B may correspondingly become the second insulating isolation layer trench 42B for NMOS depending on different mask patterns thereon. The remained part left in the insulating isolation layer is used as the insulating isolation structure of the device, that is, equivalent to the STI in the prior art. When the insulating isolation layer 30 is formed of silicon oxide, wet etching by using dilute hydrofluoric acid, or dry etching by using fluorocarbon-based, $SF_6$-based or $NF_3$-based plasma (which may also be doped with $O_2$, HBr, $CL_2$ etc.) may be performed to expose the substrate 10. Slight over-etching may also be performed, for example, over-etching to a depth of about 1~10 nm into the substrate 10 to rough the upper surface thereof, which is helpful for forming the Ge film later.

Figure 7A:
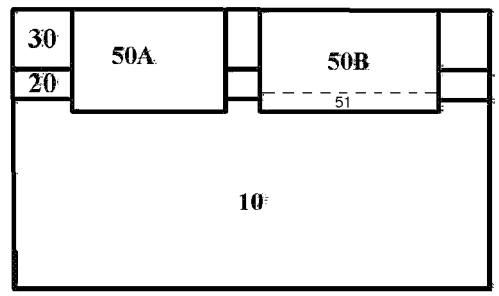
Figure 7B:
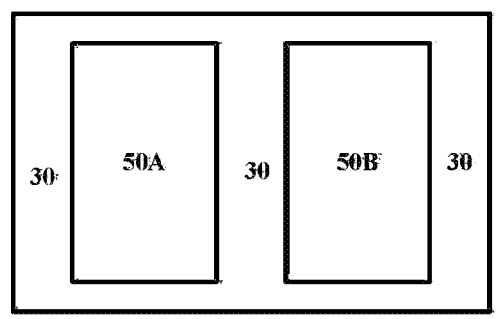

Next, referring to FIGS. 7A and 7B, a second active region layer is formed in the second insulating isolation layer trench. After the second insulating isolation layer trench 42B is formed, the mask pattern 40 is removed, and the surface of the exposed substrate 10 is wet cleaned such that the later epitaxial growth will not be affected by impurities. When the mask pattern 40 is formed of photoresist, the mask pattern 40 formed of photoresist may either be removed by organic solvent such as aceton and aromatic series or inorganic solvent consisting of sulfuric acid and hydrogen peroxide, or be removed by dry etching using oxygen plasma. When the mask pattern 40 is formed of silicon nitride, the mask pattern 40 may be removed by using hot phosphoric acid. As for the substrate 10, it may be wet cleaned, and the cleaning agent may include ammonia water, hydrogen peroxide, deionized water, dilute hydrochloric acid, dilute sulphuric acid, dilute hydrofluoric acid, dilute hydrogen nitrate, choline, Carol acid, and ozonated water etc. as well as the combinations thereof. Next, after the surface aqueous vapor and the impurity of C are removed by high temperature baking, a second active region layer 50B is epitaxially deposited in the second insulating isolation layer trench 42B, and the layer is made of a material different from that of the substrate 10 and has a carrier mobility (particularly the electron carrier mobility) higher than that of the substrate 10, for manufacturing the NMOS. In the embodiment of the present invention, the second active region layer 50B is formed of a material selected from Group III-V or Group II-IV compound, and the material may also be selected from GaAs, InAs, InSb and SiGe etc., preferably InSb in accordance with table 1. The deposition may be performed by a process such as Atomic Layer Deposition (ALD), reduced pressure chemical vapor deposition (RPCVD), ultra-high vacuum chemical vapor deposition (UHVCVD) or molecular beam epitaxy (MBE), etc. Preferably, the deposition is a low temperature deposition, with a temperature ranges from about 250° C. to 600° C. Gases such as HCl may be mixed in the feed gas to improve the selectivity of the epitaxy, that is, enabling the active region layer to be deposited within the second insulating isolation trench 42B, instead of being deposited on the insulating isolation layer 30. When the second active region layer 50B is formed by epitaxial deposition, redundant material for the active region layer is removed by chemical mechanical polishing (CMP) and/or wet cleaning to control the morphology of the second active region layer 50B, that is, removing the part that is higher than the insulating isolation layer 30. Furthermore, since the lattice constant of the material for the second active region layer 50B may be greater than that of the material Si for the substrate 10, a transition layer or buffer layer 51 (shown with a dotted line in the FIG. 7A) may be deposited in the second insulating isolation layer trench 42B prior to deposition of the second active region layer 50B, the transition layer or buffer layer may be formed of a material such as GaAs or GaN with a lattice constant between the above two (the material for the second active region layer 50B and the material Si for the substrate 10).

Figure 8A:
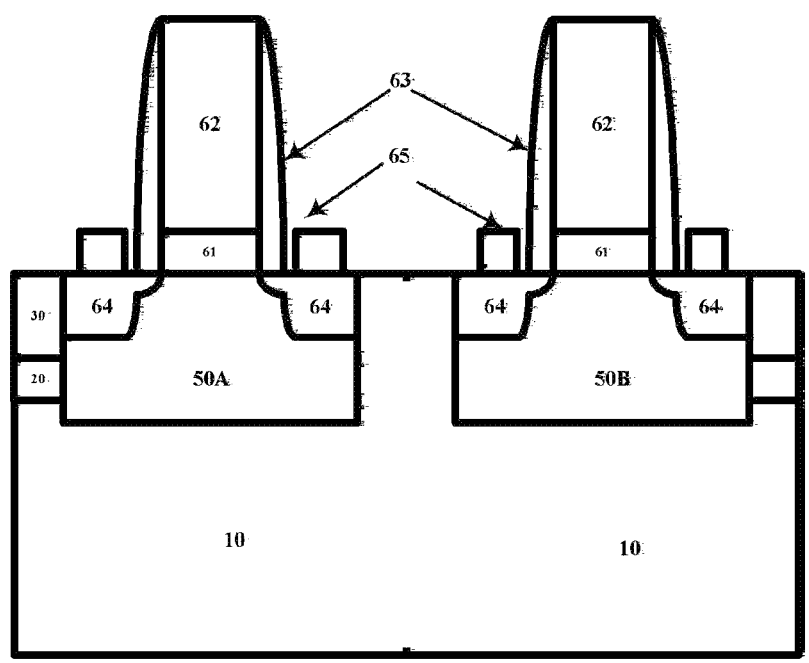
Figure 8B:
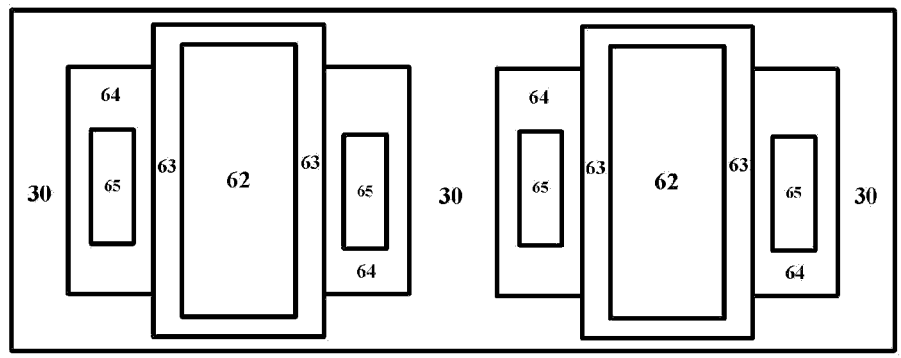

Last, referring to FIGS. 8A and 8B, a device structure is formed in the active region. In the embodiment of the present invention, CMOS is taken as an example, first, a gate insulating layer 61 and a gate material layer 62, and a cap layer such as silicon nitride (not shown) are sequentially deposited on the first active region layer 50A and the second active region layer 50B, respectively; second, photolithography/etching is performed to form a gate stack structure, and a first ion implantation is performed with the cap layer on the top of the gate stack structure as a mask to form a low doped source/drain region in the active region 50, the type of doping being different depending on the type of PMOS/NMOS; then deposition and etching are performed on both sides of the gate to form gate isolation spacers 63; a second ion implantation is performed with the gate isolation spacers 63 as a mask to form a heavily doped source/drain region in the active region 50, finally source/drain regions 64 are formed as the heavily doped regions having lightly doped source/drain structure (LDD), with a channel region of the device being located between the source/drain regions 64; and source/drain contacts 65 are formed on the source/drain regions 64. The process sequence for forming the CMOS device structure is commonly known in the art, either the first device structure for PMOS or the second device structure for NNOS may be formed first. Wherein the materials for the gate insulating layer 61 and the gate material layer 62 may be adjusted correspondingly depending on different PMOS/NMOS so as to obtain the desired work function to thereby control the threshold voltage.

The finally formed device structure is as shown in FIG. 8A, on the substrate 10 there is provided a gate insulating layer 30, in which a first active region layer 50A and a second active region layer 50B are comprised, wherein the carrier mobility of the first active region layer 50A and/or the second active region layer 50B is higher than that of the substrate 10, in and above the active region layer 50 there is formed a semiconductor device structure, comprising source/drain regions 64 of the device in the active region layer 50, a gate insulating layer 61, a gate material layer 62, and gate isolation spacers 63 above the active region layer 50, and source/drain contacts 65 above the source/drain regions 64. wherein, preferably, the material for the gate insulating layer 61 is high K materials (e.g., the dielectric constant K is greater than 3.9), for example, nitride such as SiN, MN, and AlHfN, metal oxide such as $Al_2O_3$, $Ta_2O_5$, $TiO_2$, ZnO, $ZrO_2$, $HfO_2$, $CeO_2$, and $Y_2O_3$, and perovskite phase oxide such as $PZT(PbZr_xTi_{1-x}O_3)$ and $BST(Ba_xSr_{1-x}TiO_3)$, or the combinations of all these materials, such as stack or mixture. It should be noted that no oxide of the substrate 10 and/or the active region layer 50, i.e., silicon oxide and/or germanium oxide, is comprised between the gate insulating layer 61 and the Ge in the active region, that is, a Zero Interface to improve the performance of the high K materials. The material for the gate material layer 62 may be polysilicon, metals such as Al, Au, W, Ta, Ti and/or the nitrides of these metals, or the combinations of polysilicon, metals, and metal nitrides, such as stack or mixture. Wherein the polysilicon may be doped or metal materials with an appropriate work function may be selected to control the threshold voltage of the device. The material for the source/drain contacts 65 may either be metals such as Al, Au, W, Ta, Ti and/or metal nitrides, or metal silicides such as NiSi and WSi to further decrease the contact resistance and the source/drain series resistance.

Although the semiconductor device structure illustrated in the embodiment of the present invention is an MOSFET which takes Ge film on the silicon substrate as the active region and channel region, the present invention may also be applicable to other semiconductor devices such as bipolar transistors, MESFETs, HEMTs, and diodes which take other materials as the active region or substrate, so long as the device structure and the manufacturing method thereof comprise the active region the carrier mobility thereof is higher than that of the substrate and the insulating isolation layer surrounding the active region in the present invention. Furthermore, although the embodiment of the present invention only gives an example where material of Ge is used by the PMOS active region, Group III-IV compound such as GaAs and GaN may also be used as the active region for other devices such as NMOS. Furthermore, in the embodiments of the present invention, although PMOS channel region is manufactured first while NMOS channel region is manufactured later, it may also be that NMOS channel region is manufactured first while PMOS channel region is manufactured later reversely, or it may be that a certainly material is deposited first, then different ion implantations are performed to form different lattice constants and/or carrier mobilities. Moreover, in the examples taken in the present invention, although the corresponding device structures are manufactured after the respective PMOS and NMOS channel regions are formed, it may also be that the NMOS channel region, source and drain regions as well as gates are formed after the PMOS channel region, source and drain regions as well as gates are formed first.

In accordance with the semiconductor device and the manufacturing method thereof in the present invention, an active region formed of a material different from that of the substrate is used, the carrier mobility in the channel region is enhanced, thereby the device response speed is substantially improved and the device performance is enhanced greatly. Furthermore, unlike the existing STI manufacturing process, for the present invention, an STI is formed first, and then filling is performed to form an active region, thus avoiding the problem of generation of holes in STI, and improving the device reliability.

Although the present invention has been described with reference to one or more illustrative embodiments, it may be appreciated by those skilled in the art that various appropriate modifications and equivalents can be made to the process flow without departing from the scope of the present invention.

Besides, many modifications adaptable to specific situations or materials can be made under the disclosed teaching without departing from the scope of the present invention. Therefore, the present invention does not aim to define the specific embodiments which are disclosed as the preferred embodiments for implementing the present invention, the disclosed device structure and the manufacturing method thereof will include all the embodiments that come within the scope of the present invention.

What is claimed is:

1. A method for manufacturing a semiconductor device, comprising:

forming an insulating isolation layer on a substrate;
forming a first insulating isolation layer trench in the insulating isolation layer;
forming a first active region layer in the first insulating isolation layer trench;
forming a second insulating isolation layer trench in the insulating isolation layer;
forming a second active region layer in the second insulating isolation layer trench; and
forming a semiconductor device structure in and above the first and second active region layers;
characterized in that the carrier mobility of the first and/or second active region layer is higher than that of the substrate, and in that the substrate is silicon, the first active region layer is formed of a first material with a hole mobility higher than that of the substrate, and the second active region layer is formed of a second material different from the substrate with an electron mobility higher than that of the substrate, wherein the first material is different from the second material, and both the first and second material are different from the substrate, and wherein the first and second insulating isolation layers are formed in the trenches whereby the first and second active region layers are embedded or in direct contact with the substrate.

2. The method for manufacturing a semiconductor device according to claim 1, wherein the first active region layer is formed of Ge, and the second active region layer is formed of InSb.

3. The method for manufacturing a semiconductor device according to claim 2, wherein a buffer layer formed of GaAs or GaN is formed in the second insulating isolation layer trench after it is formed.

4. The method for manufacturing a semiconductor device according to claim 1, wherein a liner layer is further formed on the substrate after the insulating isolation layer is formed, and the substrate is formed of silicon nitride or silicon oxide.

5. The method for manufacturing a semiconductor device according to claim 1, wherein the insulating isolation layer is formed by depositing silicon oxide on the substrate by high density plasma chemical vapor deposition (HDPCVD), low pressure chemical vapor deposition (LPCVD), or sub-atmospheric chemical vapor deposition (SACVD).

6. The method for manufacturing a semiconductor device according to claim 1, wherein a mask pattern is formed on the insulating isolation layer, then the insulating isolation layer is etched by taking the mask pattern as a mask to form the first and/or second insulating isolation layer trench to expose the substrate.

7. The method for manufacturing a semiconductor device according to claim 6, wherein the insulating isolation layer is over-etched down to the upper surface of the substrate.

8. The method for manufacturing a semiconductor device according to claim 1, wherein the first active region layer or the second active region layer is epitaxially deposited in the insulating isolation layer trench by Atomic Layer Deposition (ALD), reduced pressure chemical vapor deposition (RPCVD), ultra-high vacuum chemical vapor deposition (UHVCVD) or molecular beam epitaxy (MBE).

* * * * *